United States Patent [19]

Patterson

[11] Patent Number: 5,508,627

[45] Date of Patent: Apr. 16, 1996

[54] PHOTON ASSISTED SUB-TUNNELING ELECTRICAL PROBE, PROBE TIP, AND PROBING METHOD

[76] Inventor: Joseph M. Patterson, 27901 Perales, Mission Viejo, Calif. 92692

[21] Appl. No.: 240,993

[22] Filed: May 11, 1994

[51] Int. Cl.⁶ .................................................. G01R 31/302
[52] U.S. Cl. ........................ 324/752; 324/751; 324/753; 250/306
[58] Field of Search ................................... 324/752, 753, 324/751; 250/306

[56] References Cited

U.S. PATENT DOCUMENTS

| 4,837,506 | 6/1989 | Patterson . | |
|---|---|---|---|
| 5,126,660 | 6/1992 | Harrey et al. | 324/752 |
| 5,270,643 | 12/1993 | Richardson | 324/158 R |
| 5,436,448 | 7/1995 | Hosaka et al. | 250/306 |

OTHER PUBLICATIONS

Advanced Methods for Imaging Gate Oxide Defects with the Atomic Force Microscope (J. Colvin) ISTFA '92: Oct. 1992.

AFMs: What Will Their Role Be? Aug. 1993 "Semiconductor International".

Applications of Scanning Kelvin Probe Force Microscope (SKPFM) for Failure Analysis (O'Boyle, M. P.; Wickramasinghe, H. K.) ISTFA '92: Oct. 1992.

*Primary Examiner*—Kenneth A. Wieder
*Assistant Examiner*—Kourosh Cyrus Khosravi
*Attorney, Agent, or Firm*—Lyon & Lyon

[57] ABSTRACT

An improved non-contact electrical measurement system, method, probe assembly, and probe tip. A probe tip having a photoemissive coating deposited thereon is provided and disposed substantially adjacent a measurement site of a test sample. The photoemissive coating of the probe tip is illuminated by a light source, and electrical measurements are made upon the probe tip to determine the electrical characteristics of the measurement site.

28 Claims, 3 Drawing Sheets

NOTE: +V1 AND −V1 ARE FLOATING SUPPLIES, NOT REFERENCED TO GROUND. V OUT EQUALS THE VOLTAGE ON THE CONDUCTOR.

PHOTON ASSISTED SUB-TUNNELING ELECTRICAL PROBE, PROBE TIP, AND PROBING METHOD

BACKGROUND

The present invention relates generally to the field of non-contact electrical measurement devices and methods and, more specifically, to the field of non-contact electrical probes, probe tips, and methods of using the same.

Recently, a number of systems and methods have been developed for making non-contact electrical measurements on semiconductor devices, integrated circuit chips, and the like. The system disclosed in U.S. Pat. No. 4,837,506 (hereinafter "the '506 patent"), which is incorporated herein by reference, is exemplary of such a non-contact measurement system.

The '506 patent discloses a system which utilizes a stimulation source of ultraviolet light and the "photoelectric effect" to make non-contact quantitative measurements on relatively small electrical devices such as printed circuit boards, semiconductor devices, integrated circuit chips and the like.

The system disclosed in the '506 patent comprises three major components, including an ultraviolet light source, anelectron detector, and a sample chamber capable of being evacuated and accommodating the electron detector. The function of the system disclosed in the '506 patent may be summarized as follows. First, a sample (for example, an integrated circuit chip) is placed within the sample chamber on a sample stage. Next, the chamber is evacuated and a vacuum is established within the chamber. Those skilled in the art will appreciate that the vacuum established must be sufficient to allow electrons to easily travel between the sample and the electron detector. Once a sufficient vacuum is established within the chamber, the ultraviolet light source is activated, and a beam of ultraviolet (UV) light is focused and directed onto a measurement site located on the surface of the sample. When illuminated by the ultraviolet beam, the measurement site releases electrons, and the electrons, in turn, are collected by the electron detector which is disposed substantially adjacent the sample. The net charge flow between the sample measurement site and the electron detector and the voltage of the electron detector are measured and used to determine the voltage of the measurement site.

Those skilled in the art will appreciate that, because the sample is comprised of a "known" element (for example, aluminum), the "work function" of the sample is also known. The term "work function" refers to an amount of energy which is required to "free" an electron from the sample when the sample is illuminated by a beam of light having a given frequency. The energy E of a beam of light may be determined from the formula:

$$E = hV \tag{1}$$

where, h is Plank's constant, and V is the frequency of the light beam. Further, because the energy of the light beam must equal or exceed the work function of the sample when electrons are released, and because Plank's constant and the work function of a given sample are known, the frequency of light (or its inverse, the wavelength) required to free electrons from a given sample may be readily calculated. For example, in a typical case of an integrated circuit having an aluminum conductive layer, the work function of the conductive layer is between 3.8 and 4.2 eV, and light having a wavelength in the ultraviolet range (225–275 nm) is required.

In light of the above, it will readily be appreciated that, in conventional non-contact measuring systems, such as that disclosed in the '506 patent, the composition of the sample determines the wavelength of light which must be utilized by the system to achieve electron release. Because of this fact and because many semiconductor devices comprise substances having work functions in the 4.0–5.0 eV range, it is often necessary to use light in the ultraviolet spectrum to effect electron release from a sample. This is somewhat disadvantageous because optics capable of accurately focusing photons of ultraviolet light on a measurement site are very expensive.

SUMMARY OF THE INVENTION

The present invention is directed to an improved non-contact measurement system and method wherein the composition of a sample substance does not dictate the frequency of light which must be utilized to effect non-contact electrical measurements. Hence, the present invention is also directed to an improved non-contact measurement system which need not (but may) include an ultraviolet light source and the expensive optics which are required to focus a beam of ultraviolet light upon a sample measurement site. In addition, the present invention is directed to an improved probe assembly and probe tip for use in a non-contact electrical measurement system or method.

In one preferred embodiment, a non-contact measurement system in accordance with the present invention comprises a probe tip, a photoemissive coating disposed upon the probe tip, a light source, and an electrical sensor. In use, the probe tip is disposed substantially adjacent a measurement site of a sample, and the photoemissive coating deposited upon the probe tip is illuminated by a beam of light generated by the light source. The electrical sensor is then utilized to determine the voltage of the measurement site. Because the photoemissive coating utilized in accordance with the present invention provides the source of free electrons, the frequency of light utilized by a system embodying the present invention is not dictated by the composition of a sample. This allows systems and methods in accordance with the present invention to utilize (if desired) light in the visible range and, thus, eliminates the necessity of utilizing expensive optical focusing systems.

In another preferred embodiment, the probe may comprise an optical fiber having a photoemissive coating disposed on a distal tip portion thereof and a conductive coating disposed on a lateral surface thereof. In such an embodiment the photoemissive coating and the conductive coating are electrically coupled, and electrical measurements are made via the conductive coating.

In still another preferred embodiment, a current to voltage sense amplifier may be electrically coupled to the probe tip (or to the conductive coating disposed upon a fiber optic probe tip) and used to determine the voltage of a measurement site.

Another advantage inherent in the system and method of the present invention is that measurements need not be taken in a vacuum. Moreover, by positioning the probe tip of the present invention substantially adjacent (within 0.1–1.0 microns) of a measurement site, it is possible to achieve electron sub-tunnelling between the measurement site and the probe tip.

It follows that one object of the present invention is to provide an improved non-contact measurement device and method.

It is also an object of the present invention to provide an improved probe tip and probe assembly for use in non-contact electrical measurement devices and methods.

DESCRIPTION OF THE PREFERRED EMBODIMENTS

Figure 1A:
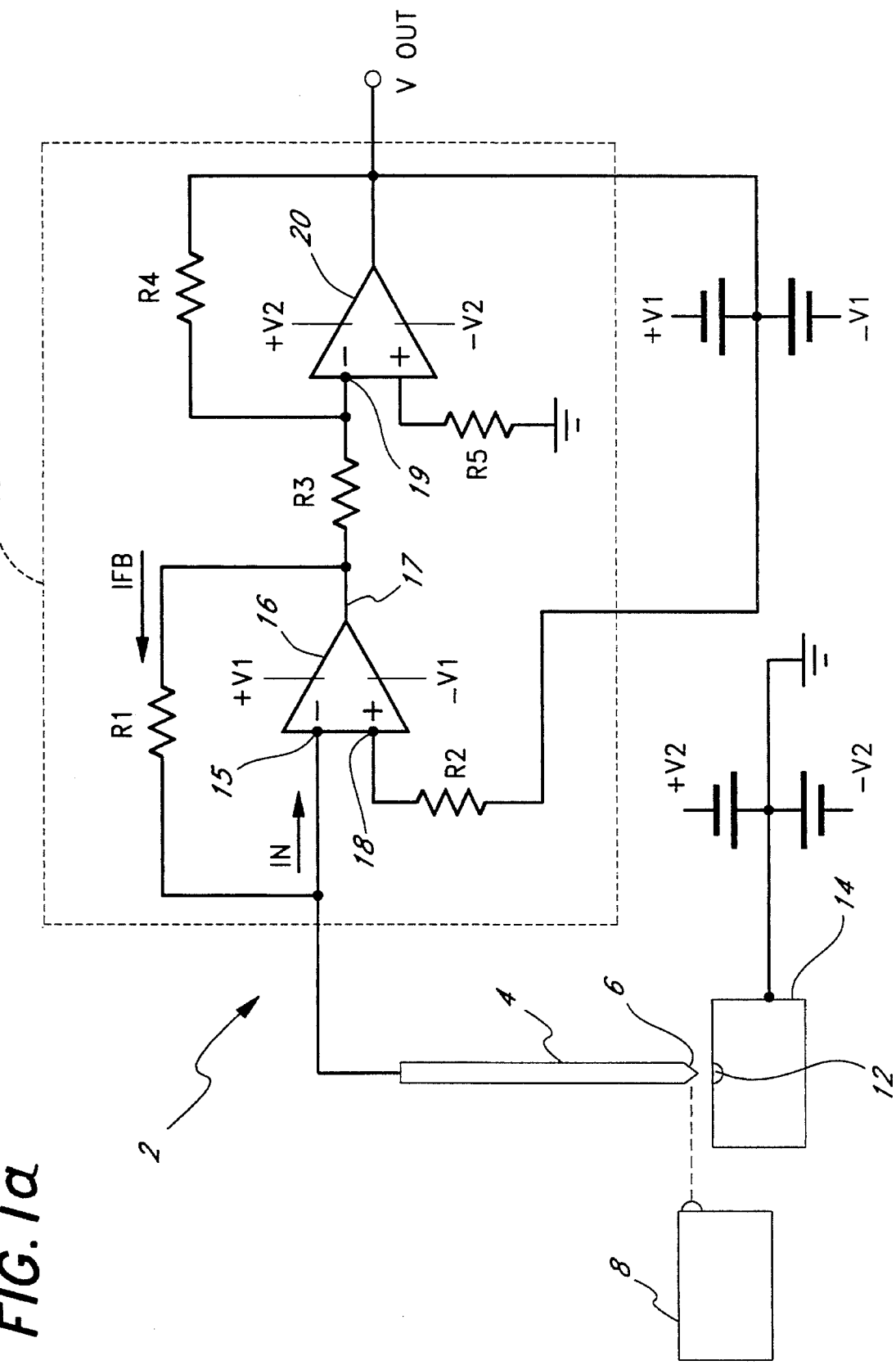
FIG. 1(a) illustrates one preferred embodiment of a probe tip and probe assembly in accordance with the present invention.
Figure 1B:
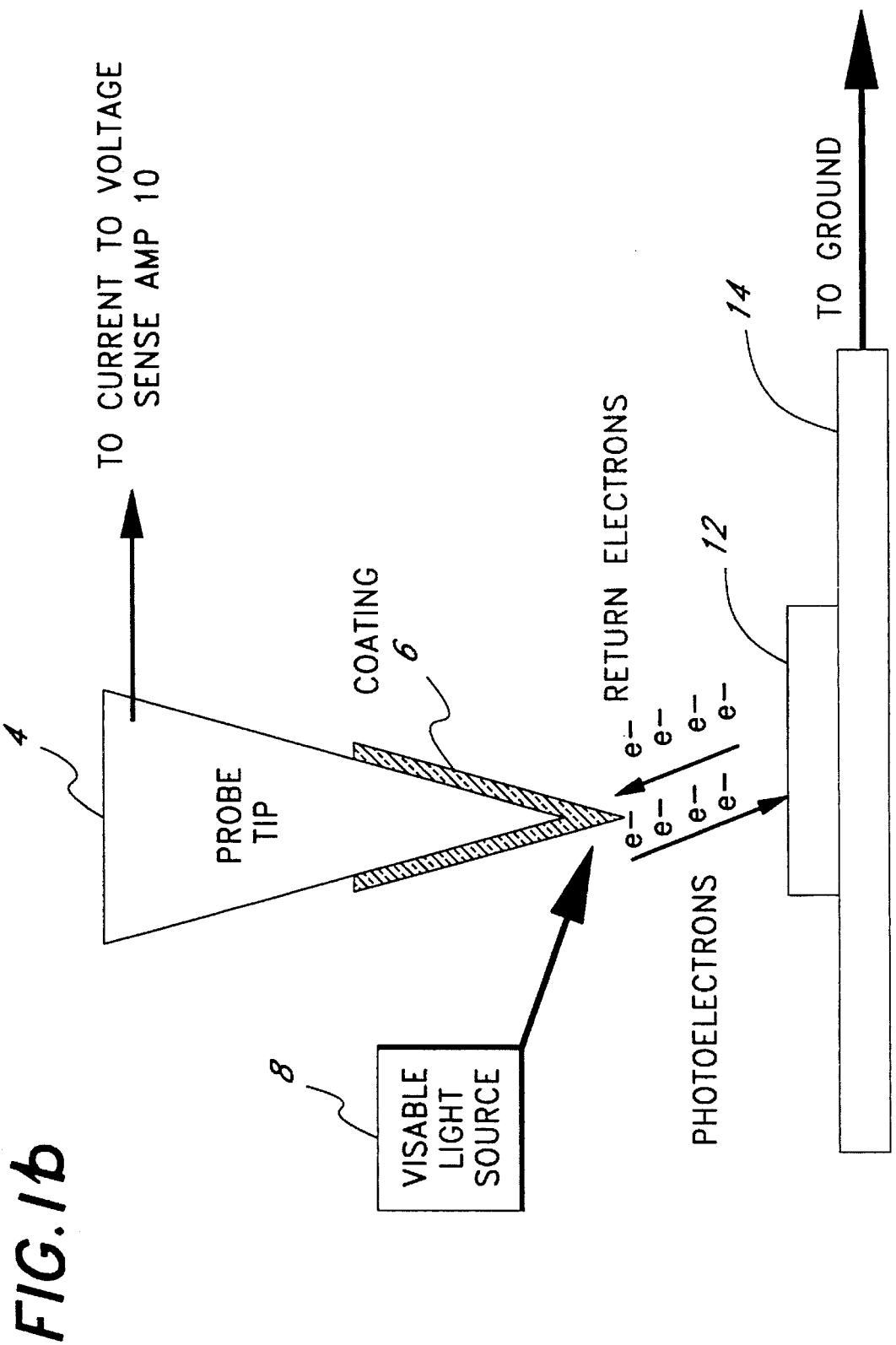
FIG. 1(b) provides an enlarged view of the probe tip of the probe assembly illustrated in FIG. 1(a).

Referring now to FIGS. 1(a) and 1(b), there are illustrated a non-contact electrical measurement device 2 (shown in FIG. 1(a)) and probe tip 4 (shown in FIG. 1(b)) in accordance with one preferred form of the invention. The non-contact electrical measurement device 2 comprises a metal probe tip 4 having a photoemissive coating 6 deposited thereon, a light source 8, and a current to voltage amplifier 10. Those skilled in the art will appreciate that voltages +V1 and −V1 of the current to voltage amplifier 10 are floating voltages, not referenced to ground, and that voltage $V_{out}$ equals the voltage on the measurement site 12 of the sample 14.

Presently preferred photoemissive coatings 6 include Lanthanumhexaboride ($LaB_6$) or Ceriumhexaboride ($CeB_6$), and probe tips 4 having either of these photoemissive coatings 6 deposited thereon may be obtained from Rocky Mountain Optics, Inc., of Denver, Colo. The presently preferred light source 8 may comprise an HeCd laser manufactured by Omnichrome of Chino, Calif. Notably, the light source 8 need not provide a beam of ultraviolet light, as the preferred photoemissive coatings 6 (Lanthanumhexaboride ($LaB_6$) or Seriumhexaboride ($SeB_6$)) have work functions in the 2.4 to 2.6 eV range, and photons in the blue range of the visible spectrum have sufficient energy to effect electron release from these coatings. For this reason, conventional optics (not shown) may be used to direct photons generated by the light source 8 onto the photoemissive coating 6. The optics used to focus photons generated by the light source 8 onto the photoemissive coating are well known in the art and, thus, are not discussed further herein.

As for the current to voltage sense amplifier 10, it is presently preferred to utilize a current to voltage sense amplifier Model No. OPA128, manufactured by Burr-Brown of Tucson, Ariz. Presently preferred resistance values for resistors R1–R5 are as follows: R1, 1000 Mχ; R2, 1 Mχ; R3, 10 Kχ; R4, 10 Kχ; and R5, 1 Kχ. However, those skilled in the art will appreciate that other resistance values and, indeed, other electrical sensors (i.e. voltage and current sensors) may be utilized to effect the voltage and current measurements described herein.

To effect measurements using the non-contact electrical measurement device 2 illustrated in FIGS. 1(a) and 1(b), it is preferred to position the probe tip 4 at a distance between 100 and 1000 angstroms from the measurement site 12. While uninhibited electron tunneling will not take place between the probe tip 4 and the measurement site 12 at such a distance, partial tunneling or "sub-tunneling" does result when the probe tip 4 is illuminated and the photoemissive coating 6 releases electrons. This enables the non-contact measurement device 2 to function in an ambient environment. However, in some instances it may be preferable to provide a rough vacuum (for example 100–5000 millipore) when effecting non-contact electrical measurements.

Once the probe tip 4 is properly positioned in relation to the measurement site 12, the photoemissive coating 6 deposited upon the probe tip 4 is illuminated with photons generated by the light source 8, and the voltage of the measurement site is determined as follows. As explained above, illumination of the photoemissive coating 6 deposited upon the probe tip 4 causes electrons to be released from the photoemissive coating 6. If the voltage of the measurement site 12 exceeds or, stated differently, is more positive than the voltage of the probe tip 4, the electrons released will leave the probe tip 4 and collect at the measurement site 12. As electrons collect at the measurement site 12, a positive current $I_{in}$ into the negative input 15 of op amp 16 will result. The voltage of the output 17 of op amp 16 will then go negative to null input current $I_{FB}$ through feedback resistor R1. This occurs because op amp 16 will attempt to maintain its inputs 15 and 18 at the same potential, and because the initial potential of its negative input 15 is 0V. The negative voltage of the output 17 of op amp 16 is then delivered to the negative input 19 of op amp 20, which is configured as a unity gain inverting amplifier. This, in turn, causes the output voltage $V_{out}$ of op amp 20 to achieve a positive potential equal in magnitude to negative voltage of the output 17 of op amp 16. Finally, output voltage $V_{out}$ is provided to the positive input 18 of op amp 16 and provides a reference voltage to the floating power supplies +V1 and −V1 of op amp 16. The result is that both inputs 15 and 18 of op amp 16 will increase in voltage until the voltage of the negative input 15 of op amp 16 reaches the voltage of the measurement site 12. At this point, the released electrons no longer leave the probe tip 4, and the input current $I_{in}$ becomes zero (0) or null. At this point, the output voltage $V_{out}$ of op amp 20 will be the same as the voltage of the measurement site 12.

Those skilled in the art will appreciate that the above discussion assumes that the work function of the photoemissive coating 6 is the same as the energy provided by the illumination. However, in practice an offset voltage will exist between the measurement site 12 and the measured voltage $V_{out}$ because the electrons leaving the photoemissive coating 6 will leave the probe tip 4 with some net energy. Moreover, in practice the net energy of the released electrons will equal the difference between the energy of illumination and the work function of the photoemissive coating 6. This energy will generally fall somewhere in the range of 0.5 to 1.0 Ev, and a correction of this offset can be introduced in a conventional fashion at the positive input of op amp 20.

Figure 2:
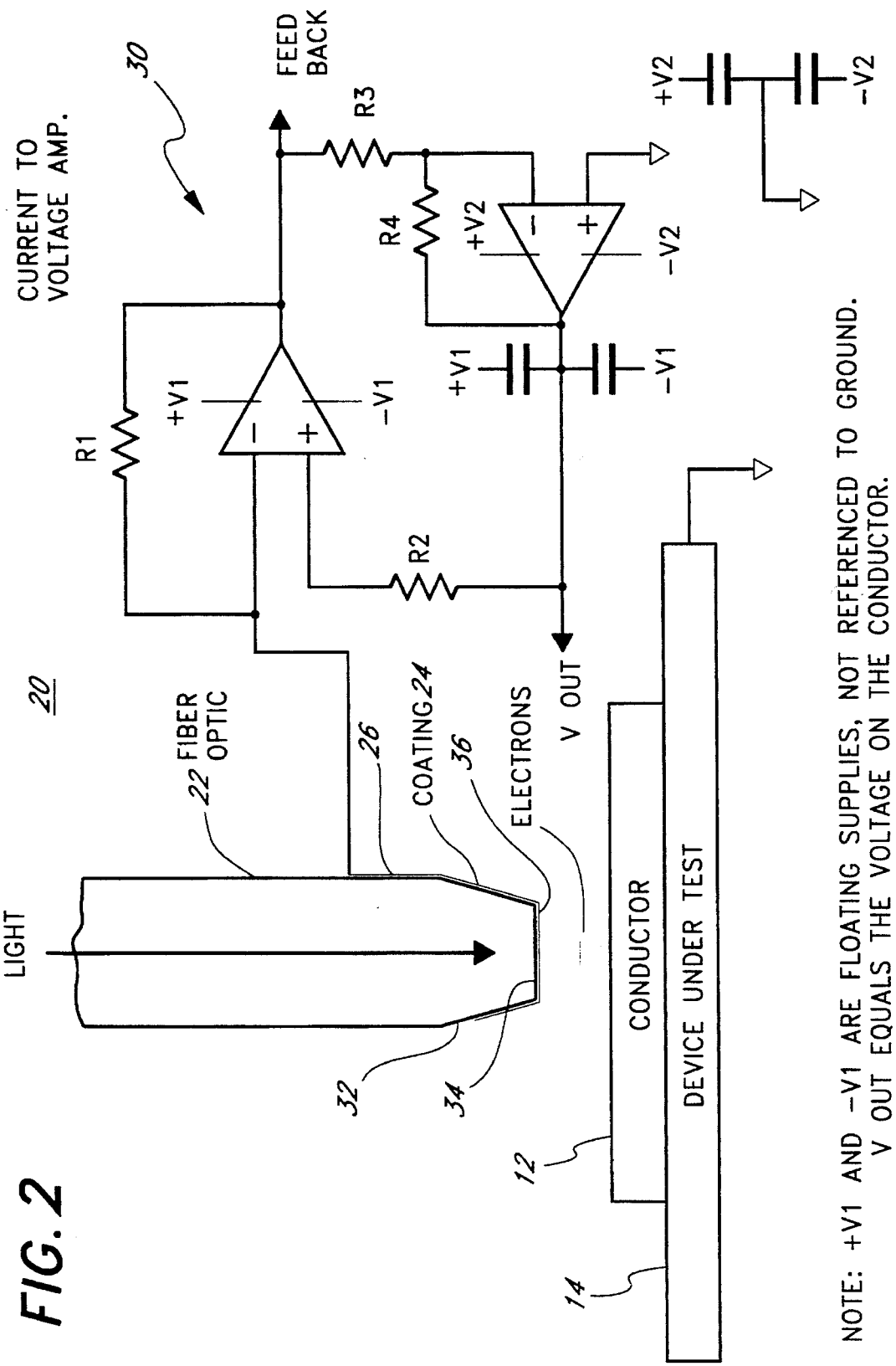
FIG. 2 illustrates a second preferred embodiment of a probe tip and probe assembly in accordance with the present invention.

Turning now to FIG. 2, in another preferred form a non-contact electrical measurement device 20 in accordance with the present invention may comprise an optical fiber 22 having a photoemissive coating 24 deposited upon a distal tip portion thereof and a conductive coating 26 deposited upon a lateral surface thereof; a light source (not shown) optically coupled to a proximal end of the optical fiber 22; and a current to voltage sense amplifier 30 electrically coupled to the conductive coating 26. The optical fiber 22 may comprise a quartz type fiber, manufactured and distributed by Oriel Corp. of Stanford, Connecticut, and may have a tapered distal tip 32 terminating at a planar distal surface 34. The optical fiber 22 may be coupled to the light source (for example, a HeCd laser) via a conventional optical coupling device such as a standard SMA 905 connector (not shown). The photoemissive coating 24 should be deposited upon the planar surface 34 of the optical fiber 22, and the thickness of the coating 24 should be (limited such that light may pass to the external surface 36 of the coating 24. In an alternative embodiment (not shown), the tapered distal tip 32 may terminate in a point and the photoemissive coating 24 may be deposited over a distal portion of the point. In either case, the conductive coating 26 should be electrically coupled,to the photoemissive coating 24 and should not impede the passage of light from the optical fiber 22 to the external surface 36 of the photoemissive coating 24.

As for the composition of the coatings 24 and 26, preferable photoemissive coatings 24 comprise either Lanthanumhexaboride ($LaB_6$) or Ceriumhexaboride ($CeB_6$), and a preferable conductive coating 26 comprises gold (Au).

The current to voltage sense amplifier 30 is preferably the same current to voltage sense amplifier described above with reference to FIGS. 1(a) and 1(b) and functions in the fashion described above.

While the invention described herein is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. An electrical probe comprising:

a probe tip;

a photoemissive coating disposed upon said probe tip;

a light source for generating photons of a selected wavelength and directing said photons toward said photoemissive coating disposed upon said probe tip; and an electrical sensor electrically coupled to said probe tip for measuring an electrical characteristic of said probe tip when said photons are directed by said light source to said photoemissive coating.

2. The electrical probe of claim 1 where in said electrical sensor comprises a current to voltage sense amplifier.

3. The electrical probe of claim 1 wherein said light source comprises a laser which directs a beam of coherent light onto said photoemissive coating.

4. The electrical probe of claim 3 wherein said coherent light has a frequency within a spectrum of visible light.

5. The electrical probe of claim 1 wherein said photoemissive coating comprises either Lanthanumhexaboride ($LaB_6$) or Ceriumhexaboride ($CeB_6$).

6. The electrical probe of claim 1 wherein:

said probe tip comprises an optical fiber having a conical tip;

said photoemissive coating is deposited upon a distal portion of said conical tip of said optical fiber;

a conductive coating is deposited upon a lateral surface portion of said optical fiber, said conductive coating forming an electrical coupling between said photoemissive coating and said current to voltage sense amplifier; and said light source is capable of optically coupling to a proximal end of said optical fiber.

7. The electrical probe of claim 1 wherein:

said probe tip comprises an optical fiber having a tapered distal tip leading to a planar distal surface;

said photoemissive coating is deposited upon said planar distal surface of said optical fiber;

a conductive coating is deposited upon a lateral surface portion of said optical fiber, said conductive coating forming an electrical coupling between said photoemissive coating and said current to voltage sense amplifier; and said light source is capable of optically coupling to a proximal end of said optical fiber.

8. A non-contact electrical probe comprising:

a probe tip;

a photoemissive coating disposed upon said probe tip;

a light source for generating photons of a selected wavelength and directing said photons toward said photoemissive coating disposed upon said probe tip; and a voltage sensor coupled to said probe tip for sensing a voltage of said probe tip, when said photons are directed to said photoemissive coating.

9. The non-contact electrical probe of claim 8 further comprising a current sensor capable of coupling in circuit between said probe tip and a measurement site of a sample for sensing a flow of electrons between said probe tip and said measurement site.

10. The non-contact electrical probe of claim 8 wherein said light source comprises a laser which directs a beam of coherent light onto said photoemissive coating.

11. The non-contact electrical probe of claim 8 wherein said photoemissive coating comprises either Lanthanumhexaboride ($LaB_6$) or Ceriumhexaboride ($CeB_6$).

12. The non-contact electrical probe of claim 8 wherein:

said probe tip comprises a sharpened optical fiber;

said photoemissive coating is deposited upon a distal tip portion of said sharpened optical fiber;

a conductive coating is deposited upon a lateral surface portion of said optical fiber, said conductive coating forming an electrical coupling between said photoemissive coating and said voltage sensor; and said light source is coupled to a proximal end of said optical fiber.

13. The electrical probe of claim 8 wherein said voltage sensor comprises a current to voltage sense amplifier.

14. A photon assisted sub-tunneling electrical probe comprising:

a probe having a sharpened probe tip;

a photoemissive coating deposited upon said sharpened tip of said probe;

a source of light for generating photons of a selected wavelength within a visible spectrum and directing said photons toward said photoemissive coating disposed upon said sharpened tip of said probe, said source of light comprising a laser; and a current sensor capable of being connected in circuit between said probe tip and a measurement site for sensing a flow of electrons between said photoemissive coating and said measurement site when said photoemissive coating is illuminated by said laser; and a voltage sensor coupled to said probe tip for sensing a voltage of said probe tip.

15. The photon assisted sub-tunneling electrical probe of claim 14 wherein said photoemissive coating comprises either Lanthanumhexaboride ($LaB_6$) or Ceriumhexaboride ($CeB_6$).

16. A photon assisted sub-tunneling electrical probe comprising:
- an optical fiber having a sharpened distal tip;
- a photoemissive coating disposed upon said sharpened distal tip of said optical fiber;
- a source of visible light coupled to a proximal end of said optical fiber;
- a current sensor capable of being connected in circuit between said photoemissive coating and a measurement site for sensing a flow of electrons between said photoemissive coating and said measurement site when said photoemissive coating is illuminated by light generated by said visible light source.

17. The photon assisted sub-tunneling electrical probe of claim 16 further comprising a voltage sensor coupled to said photoemissive coating for sensing a voltage of said photoemissive coating.

18. The photon assisted sub-tunneling electrical probe of claim 16 wherein said photoemissive coating comprises either Lanthanumhexaboride ($LaB_6$) or Ceriumhexaboride ($CeB_6$).

19. The photon assisted sub-tunneling electrical probe of claim 17 wherein a conductive coating is deposited upon a lateral surface of said optical fiber and provides an electrical connection between said photoemissive coating and said voltage sensor.

20. The photon assisted sub-tunneling electrical probe of claim 19 wherein said conductive coating is comprised of gold (Au).

21. A method for measuring a voltage at a selected location on a semiconductor device, said method comprising the steps of:
- providing an electrical probe comprising a probe tip; a photoemissive coating disposed upon said probe tip; a light source for generating photons of a selected wavelength and directing said photons toward said photoemissive coating disposed upon said probe tip; and an electrical sensor electrically coupled to said probe tip;
- positioning said electrical probe at a distance between 0.1 and 1.0 microns from said selected location;
- illuminating said photoemissive coating with said photons generated by said light source; and
- sensing a voltage of said probe tip.

22. The method of claim 21 wherein said probe tip comprises a distal tip of an optical fiber; a conductive coating is deposited on a lateral surface of said optical fiber providing an electrical circuit between said photoemissive coating and electrical sensor; and said light source is optically coupled to a proximal end of said optical fiber.

23. A method of electrical measurement comprising the steps of:
- positioning a photoemissive substance at a location sufficiently adjacent a measurement site to allow sub-tunneling of electrons between said photoemissive substance and said measurement site;
- illuminating said photoemissive substance with photons of light; and
- determining a voltage of said measurement site by measuring an electrical characteristic of said photoemissive substance when said photoemissive substance is illuminated by said photons.

24. The method of claim 23 wherein said determining step comprises the steps of:
- measuring a net flow of electrons between said photoemissive substance and said measurement site; and
- measuring a voltage of a conductor electrically coupled to said photoemissive coating when said net flow of electrons between said photoemissive substance and said measurement site is null.

25. The method of claim 23 wherein said photoemissive substance comprises either Lanthanumhexaboride ($LaB_6$) or Ceriumhexaboride ($CeB_6$).

26. The method of claim 23 wherein said light has a wavelength within a spectrum of visible light.

27. A method for providing free electrons at a measurement site of a sample, said method comprising the steps of:
- positioning a photoemissive substance at a location sufficiently adjacent said measurement site to allow sub-tunneling of electrons between said photoemissive substance and said measurement site; and
- illuminating said photoemissive substance with photons of light having a preselected frequency.

28. The method of claim 27 wherein said photoemissive substance is either Lanthanumhexaboride ($LaB_6$) or Ceriumhexaboride ($CeB_6$), and said photons of light have a frequency within a spectrum of visible light.

* * * * *